(12) United States Patent
Masui et al.

(10) Patent No.: US 7,830,940 B2
(45) Date of Patent: Nov. 9, 2010

(54) NITRIDE SEMICONDUCTOR LASER ELEMENT HAVING NITRIDE SEMICONDUCTOR SUBSTRATE AND NITRIDE SEMICONDUCTOR LAYER LAMINATED THEREON WITH NITRIDE SEMICONDUCTOR SUBSTRATE AND NITRIDE SEMICONDUCTOR LAYER HAVING RECESSES FORMED IN HIGH DISLOCATION DENSITY REGION OF NITRIDE SEMICONDUCTOR SUBSTRATE AND NITRIDE SEMICONDUCTOR LAYER HAVING PORTIONS WITH DIFFERENT FILM THICKNESSES

(75) Inventors: Shingo Masui, Anan (JP); Tomonori Morizumi, Anan (JP)

(73) Assignee: Nichia Corporation, Anan-shi (JP)

( * ) Notice: Subject to any disclaimer, the term of this patent is extended or adjusted under 35 U.S.C. 154(b) by 184 days.

(21) Appl. No.: 11/849,734

(22) Filed: Sep. 4, 2007

(65) Prior Publication Data
US 2008/0056322 A1    Mar. 6, 2008

(30) Foreign Application Priority Data

Sep. 4, 2006  (JP) .............................. 2006-239161
Aug. 31, 2007 (JP) .............................. 2007-225572

(51) Int. Cl.
*H01S 5/00* (2006.01)
*H01L 23/58* (2006.01)

(52) U.S. Cl. ................................. 372/46.012; 257/594
(58) Field of Classification Search ............ 372/46.012; 257/594
See application file for complete search history.

(56) References Cited

U.S. PATENT DOCUMENTS

| 7,109,049 B2 * | 9/2006 | Takakura et al. ............... 438/28 |
| 7,157,297 B2 * | 1/2007 | Kamikawa et al. ............ 438/33 |
| 2004/0251519 A1 * | 12/2004 | Sugahara et al. ............ 257/615 |
| 2005/0221590 A1 * | 10/2005 | Kano et al. .................. 438/476 |
| 2008/0210957 A1 * | 9/2008 | Watanabe et al. .............. 257/89 |

FOREIGN PATENT DOCUMENTS

| JP | 2004-327879 A | 11/2004 |
| JP | 2005-191547 A | 7/2005 |
| JP | 2005-294416 A | 10/2005 |
| JP | 2006-059973 A | 3/2006 |

* cited by examiner

*Primary Examiner*—Tod T. Van Roy
*Assistant Examiner*—Marcia A. Golub-Miller
(74) *Attorney, Agent, or Firm*—Global IP Counselors, LLP

(57) ABSTRACT

A nitride semiconductor laser element comprises a nitride semiconductor substrate and a nitride semiconductor layer laminated thereon, wherein the nitride semiconductor substrate has a high dislocation density region and a low dislocation density region containing lower dislocation than that of the high dislocation density region, and has at least one recess formed in at least the high dislocation density region, the nitride semiconductor layer has a first nitride semiconductor layer in which the grown film thickness in the lateral direction from the side faces of the recess in the substrate is greater than the grown film thickness in the heightwise direction from a region other than the recess, and a second nitride semiconductor layer that is disposed on the first nitride semiconductor layer and contains indium, and the first nitride semiconductor layer and second nitride semiconductor layer have recess over the recess in the nitride semiconductor substrate.

23 Claims, 7 Drawing Sheets

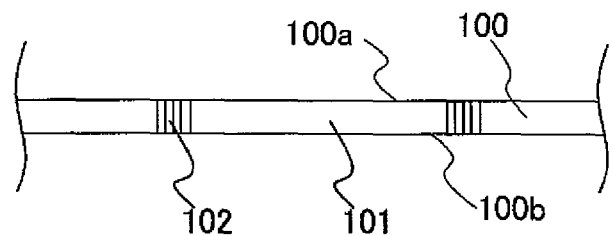
Fig.1a
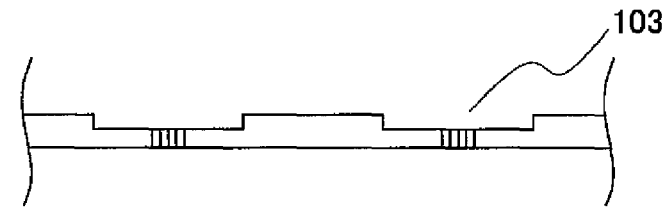
Fig.1b
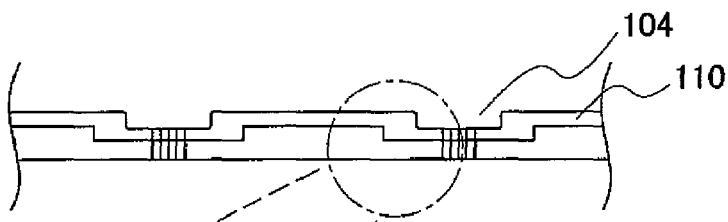
Fig.1c
Fig.1c'
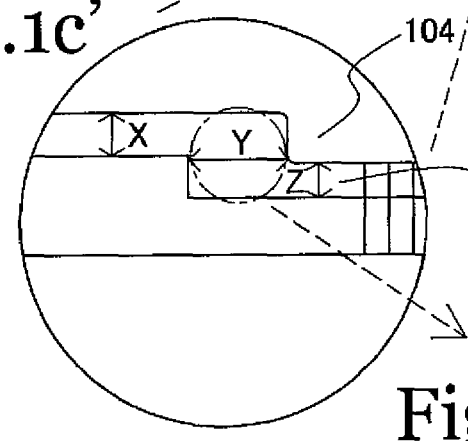
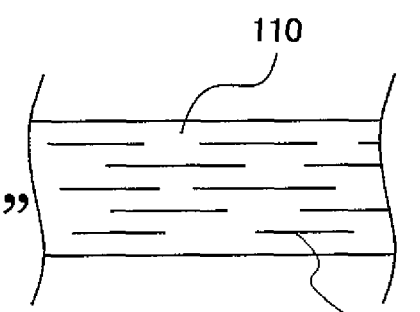
Fig.1c"
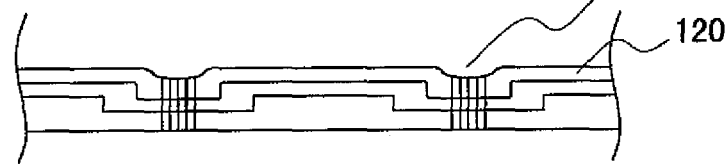
Fig.1d
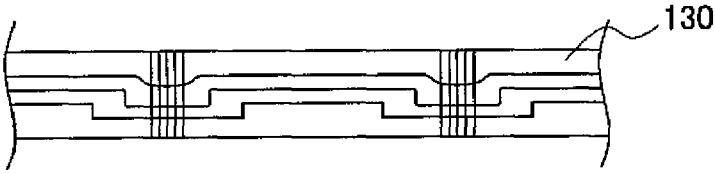
Fig.1e

NITRIDE SEMICONDUCTOR LASER ELEMENT HAVING NITRIDE SEMICONDUCTOR SUBSTRATE AND NITRIDE SEMICONDUCTOR LAYER LAMINATED THEREON WITH NITRIDE SEMICONDUCTOR SUBSTRATE AND NITRIDE SEMICONDUCTOR LAYER HAVING RECESSES FORMED IN HIGH DISLOCATION DENSITY REGION OF NITRIDE SEMICONDUCTOR SUBSTRATE AND NITRIDE SEMICONDUCTOR LAYER HAVING PORTIONS WITH DIFFERENT FILM THICKNESSES

BACKGROUND OF THE INVENTION

1. Field of the Invention

The present invention relates to a nitride semiconductor laser element and a method for manufacturing the nitride semiconductor laser element.

2. Background Information

Nitride semiconductor laser elements hold promise as light sources for next-generation optical disks, light sources for displays, and light sources for exposures.

A nitride semiconductor substrate is used for growing a semiconductor layer in a nitride semiconductor laser element. A nitride semiconductor substrate has high dislocation density regions and low dislocation density regions.

A nitride semiconductor layer with a laminar structure is obtained by crystal growth of a nitride semiconductor layer by metal-organic chemical vapor deposition (MOCVD), for example.

Low manufacturing yield is generally a problem with nitride semiconductor laser elements, and the substrate is one of the reasons for this.

At present, a GaN substrate is used as a growth substrate for growing a nitride semiconductor layer. A GaN substrate is different from a GaAs substrate or InP substrate in that manufacturing a low-dislocation substrate that is uniform overall in the form of a wafer is difficult. And even if a low-dislocation substrate can be manufactured, a new problem is the increased diameter of the substrate. Accordingly, GaN substrates in which dislocations are included in the wafer are being used at present. When a GaN substrate such as this is used as a substrate for growing a nitride semiconductor layer, dislocations propagate from the high dislocation density regions of the substrate to the nitride semiconductor layer. This poses the risk of adversely affecting the characteristics of the drive (main light emission) region of the nitride semiconductor layer.

Also, since the lattice constants do not match perfectly between the GaN substrate and the nitride semiconductor layer, tensile strain is produced in the nitride semiconductor layer. This tensile strain creates cracks within the wafer, which lower the yield of the product.

A nitride semiconductor laser element in which recesses are formed has been proposed in order to solve these problems (see JP-2004-327879-A).

The nitride semiconductor laser element disclosed in this Patent Document is produced by growing a nitride semiconductor layer on a nitride semiconductor substrate, and then forming recesses in the nitride semiconductor layer. These recesses prevent dislocations (defects) from propagating to the laser waveguide region or the area around the laser waveguide region.

Also, a technique has been proposed in which recesses are formed in high dislocation density regions (regions of concentrated dislocations) and low dislocation density region (regions of non-concentrated dislocations) (see JP-2005-294416-A).

As disclosed in FIGS. 12 and 13 of this Patent Document, this technique involves growing a nitride semiconductor layer on a nitride semiconductor substrate having recesses.

However, with JP-2004-327879-A, since the recesses are formed after the nitride semiconductor layer has been grown on the nitride semiconductor substrate, any dislocations (defects) that occurred at the stage of growing the nitride semiconductor layer, and particularly any dislocations that have propagated to the laser waveguide region, cannot be eliminated. Also, growing the nitride semiconductor layer over a nitride semiconductor substrate that includes dislocations makes tensile strain more likely to occur, so cracks are more prone to develop. Furthermore, tensile strain is produced by etching, growing the nitride semiconductor layer, and so forth in subsequent device steps, and this is another source of new cracks.

With JP-2005-294416-A, merely forming recesses in the high dislocation density region can prevent the reoccurrence of dislocations, but it can not adequately suppress cracking, therefore producing nitride semiconductor laser elements at a stable yield cannot be expected.

SUMMARY OF THE INVENTION

The present invention is conceived in an effort to solve the above problems. As a specific example, it is an object of the present invention to provide a nitride semiconductor laser element in which a nitride semiconductor layer is grown on a nitride semiconductor substrate having high dislocation density regions and low dislocation density regions, wherein the propagation of dislocations from the high dislocation density region to the drive (main light emission) region of the nitride semiconductor layer, and the generation of tensile strain can be suppressed, and to provide a method for manufacturing this element.

The present invention provides a nitride semiconductor laser element comprising a nitride semiconductor substrate and a nitride semiconductor layer laminated thereon, wherein the nitride semiconductor substrate has a high dislocation density region and a low dislocation density region containing lower dislocation than that of the high dislocation density region, and has at least one recess formed in at least the high dislocation density region, the nitride semiconductor layer has a first nitride semiconductor layer in which the grown film thickness in the lateral direction from the side faces of the recess in the substrate is greater than the grown film thickness in the heightwise direction from a region other than the recess, and a second nitride semiconductor layer that is disposed on the first nitride semiconductor layer and contains indium, and the first nitride semiconductor layer and second nitride semiconductor layer have recess over the recess in the nitride semiconductor substrate.

Further, the present invention provides a method for manufacturing a nitride semiconductor laser element comprising a nitride semiconductor substrate which has a high dislocation density region and a low dislocation density region containing lower dislocation than that of the high dislocation density region and a nitride semiconductor layer laminated thereon, the method comprising the steps of: forming at least one recess in the high dislocation density region of the nitride semiconductor substrate; forming a first nitride semiconductor layer on the nitride semiconductor substrate such that the grown film thickness in the lateral direction from the side faces of the recess in the substrate is greater than the grown film thickness in the heightwise direction from a region other than the recess; and forming a second nitride semiconductor layer that contains indium on the first nitride semiconductor layer.

Moreover, the present invention provides a nitride semiconductor laser element comprising a nitride semiconductor substrate and a nitride semiconductor layer laminated thereon, wherein the nitride semiconductor substrate has a high dislocation density region and a low dislocation density region containing lower dislocation than that of the high dislocation density region, and had at least one recess formed in at least the high dislocation density region, the nitride semiconductor layer has a first nitride semiconductor layer in which the grown film thickness in the lateral direction from the side faces of the recess in the substrate is greater than the grown film thickness in the heightwise direction from a region other than the recess, and dislocations extending in the in-plane direction are present in the region of growth of the first nitride semiconductor layer in the lateral direction.

Furthermore, the present invention provides a nitride semiconductor laser element comprising a nitride semiconductor substrate and a nitride semiconductor layer laminated thereon, wherein the nitride semiconductor substrate has the dislocation density of no more than $1 \times 10^7/cm^2$ at the substrate surface, and has at least one recess formed in the substrate surface, the nitride semiconductor layer has a first nitride semiconductor layer in which the grown film thickness in the lateral direction from the side faces of the recesses in the substrate is greater than the grown film thickness in the heightwise direction from a region other than the recess, and the density of the dislocations extending in the in-plane direction in the region of growth of the first nitride semiconductor layer in the lateral direction is at least $1 \times 10^8/cm^2$.

With the present invention, dislocations that attempt to propagate from the high dislocation density regions included in a nitride semiconductor substrate to the entire wafer can be preferentially converged in recesses. This suppresses the propagation of dislocations to the drive (main light emission) region of the nitride semiconductor layer, and the development of cracks within the nitride semiconductor layer.

It also suppresses cracking caused by expansion of the element due to heat (elevated temperature) produced during the drive of the nitride semiconductor laser element, so stable service life characteristics are exhibited, and excellent laser characteristics can be achieved.

Also, with the method of the present invention for manufacturing a nitride semiconductor laser element, the development of tensile strain within the wafer can be suppressed. This prevents cracks from developing in a subsequent design step, and allows a method to be provided for manufacturing a nitride semiconductor laser element with increased product yield.

The nitride semiconductor laser element of the present invention, and the method for manufacturing this element, can be utilized as light sources for next-generation optical disks, light sources for displays, light sources for printers, and so forth.

Also, the nitride semiconductor laser element of the present invention, and the method for manufacturing this element, can be used not only in applications having a Fabry-Perot resonator that uses feedback at the end face, but also to applications having DFB (distributed feedback) in which feedback is performed by providing a diffraction grating in the interior, or a DBR (distributed Bragg reflector) in which feedback is performed by providing a diffraction grating in the exterior.

BRIEF DESCRIPTION OF THE DRAWINGS

FIGS. 1a to 1e are schematic cross-sectional views showing a manufacturing a nitride semiconductor laser device according to the present invention;

DETAILED DESCRIPTION OF THE PREFERRED EMBODIMENTS

Embodiments of the nitride semiconductor laser element and its manufacturing method pertaining to the present invention will now be described through reference to the drawings. The present invention is not, however, limited to or by the attached drawings.

Embodiment 1

Figure 2:
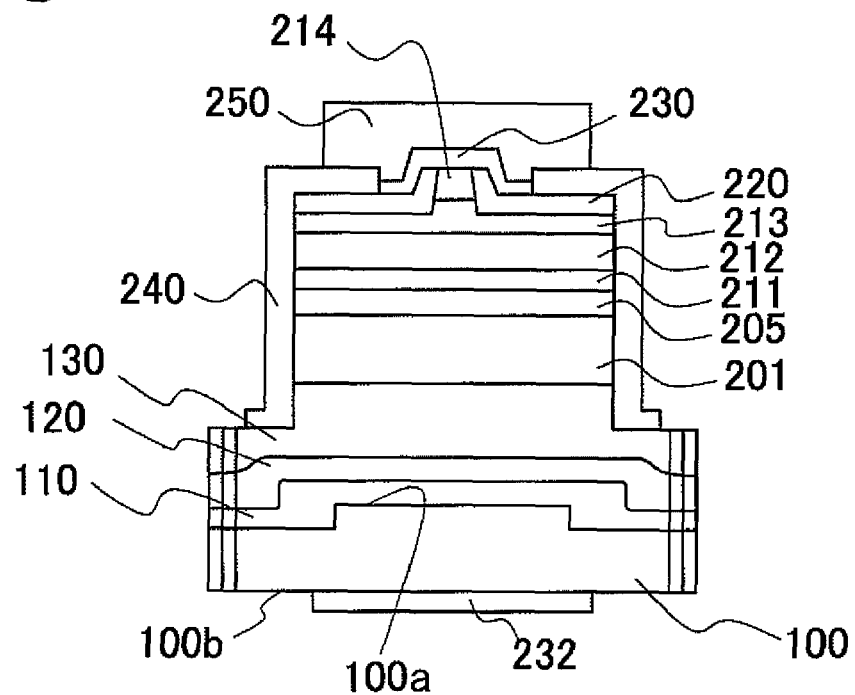
FIG. 2 to FIG. 5 and FIG. 7 are schematic cross-sectional views showing nitride semiconductor laser devices of the present invention, respectively.

As shown in FIG. 2, this nitride semiconductor laser element comprises a nitride semiconductor layer laminated on the front side 100a of a nitride semiconductor substrate 100. This nitride semiconductor layer has a first nitride semiconductor layer 110 and a second nitride semiconductor layer 120 in that order from the front side 100a of the nitride semiconductor substrate 100. An active layer 205 and so forth are laminated on this. An-electrode 232 is formed on the rear side 100b of the nitride semiconductor substrate 100.

Such laser element has a structure wherein the active layer is interposed between a n-type semiconductor layer and a p-type semiconductor layer. The active layer 205 may be a multiple quantum well or single quantum well structure. Also, the laser element of the present invention may be a SCH (Separate Confinement Heterostructure) wherein an optical waveguide is constituted by providing optical guide layers above and below the active layer.

The manufacturing step of growing the nitride semiconductor layer on the nitride semiconductor substrate 100 will now be described.

First, the nitride semiconductor substrate 100 is provides.

As shown in FIG. 1a, this nitride semiconductor substrate 100 comprises high dislocation density regions 102 in which are concentrated stripe-like dislocations passing all the way from the front side 100a to the rear side 100b, and low dislocation density regions 101 within the other region of the high dislocation density regions 102.

The low dislocation density regions 101 are regions with fewer dislocations per unit of surface area than the high dislocation density regions 102. The number of dislocations per unit of surface area of the low dislocation density regions 101 is $1 \times 10^7/cm^2$ or less, preferably $5 \times 10^6/cm^2$ or less and more preferably $1 \times 10^6/cm^2$ or less. The high dislocation density regions 102 are regions with more dislocations per unit of surface area than the low dislocation density regions 101, and there are no particular restrictions on the number thereof. Dislocation density is preferably measured by CL (cathode luminescence) observation, TEM observation, or the like.

The nitride semiconductor substrate may be a round or square wafer, and may be at least 1 inch, preferably at least 2 inch in size.

This nitride semiconductor substrate 100 preferably has an off angle of 0.05 to 1.0° on the front side 100a and/or the rear side 100b. The off angle may be formed by abrasion, grinding, laser surface treatments, or the like. This stabilizes the element characteristics within a range in which the oscillation wavelength of the laser element is from the ultraviolet band (365 nm and under) to the long wavelength band (500 nm and over). More specifically, this allows the compositional distribution of the active layer within a chip to be more uniform.

Also, the thickness of the nitride semiconductor substrate 100 may be at least 50 μm and no more than 1 mm, preferably at least 100 μm and no more than 500 μm.

The nitride semiconductor substrate 100 can be formed by a vapor phase growth method such as MOCVD, HVPE, MBE, or the like, a hydrothermal synthesis method in which crystals are grown in a supercritical fluid, a high pressure method, a flux method, a melt method, or the like.

GaN, AlN, AlGaN substrates or other substrates can be used as the nitride semiconductor substrate, GaN substrate is used in this embodiment.

The front side 100a of the nitride semiconductor substrate 100 is the C (0001) plane, M (1-100) plane, or A (11-20) plane. If the front side 100a of the nitride semiconductor substrate 100 is the C (0001) plane, then the rear side 100b is the (000-1) plane.

A nitride semiconductor substrate may be obtained by forming a nitride semiconductor layer on a different type of substrate which is made of a different material than a nitride semiconductor, and then removing the different type of substrate. This nitride semiconductor substrate may be a GaN substrate in which the entire front side 100a is low in dislocations.

Also, the nitride semiconductor substrate 100 has a full width at half maximum of 2 minutes or less, preferably 1 minutes or less in a (0002) diffraction X-ray rocking curve produced by biaxial crystal method. The radius of curvature of the nitride semiconductor substrate 100 may be at least 0.1 m, and at least 1 m. In this Specification, a bar in parentheses (-) expressing a plane index expresses a bar to be added over the next numeral.

Next, as shown in FIG. 1b, at least one recess 103 is formed on the nitride semiconductor substrate 100, preferably over every high dislocation density regions 102, the recesses 103 are formed. This recesses 103 are formed in a width extending over the high dislocation density regions 102 of the nitride semiconductor substrate 100 and to the low dislocation density regions 101 on both sides thereof. The recesses 103 is arranged in parallel with a direction of cavity length of a nitride semiconductor laser element which is formed at the following step.

These recesses are not necessarily limited to being formed in just the high dislocation density regions 102, and as shown in FIG. 1b, may be formed over part of the low dislocation density regions 101 on both sides of the high dislocation density regions 102. It is preferable for the side faces of the recesses 103 to be the low dislocation density regions 101 because there will be less propagation of dislocations from the recess side faces.

Figure 6A:
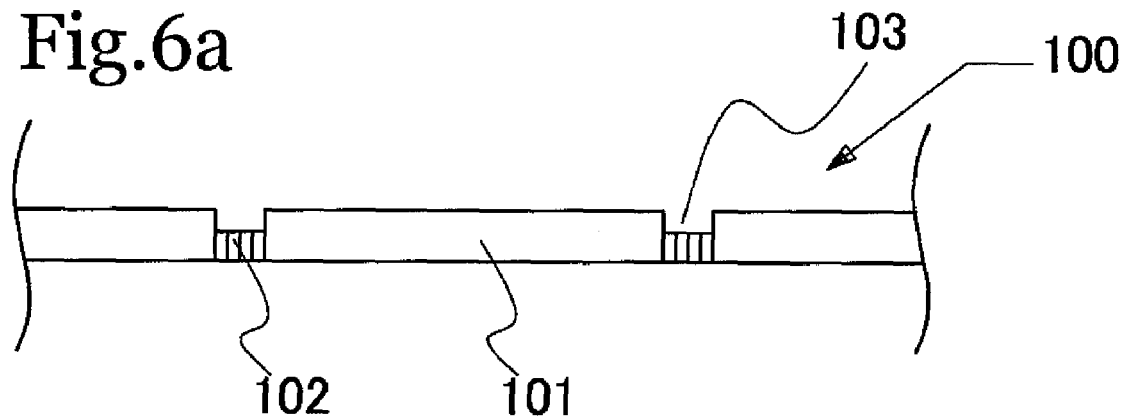
FIGS. 6a to 6c are schematic cross-sectional views showing nitride semiconductor substrates of the present invention, respectively.
Figure 6B:
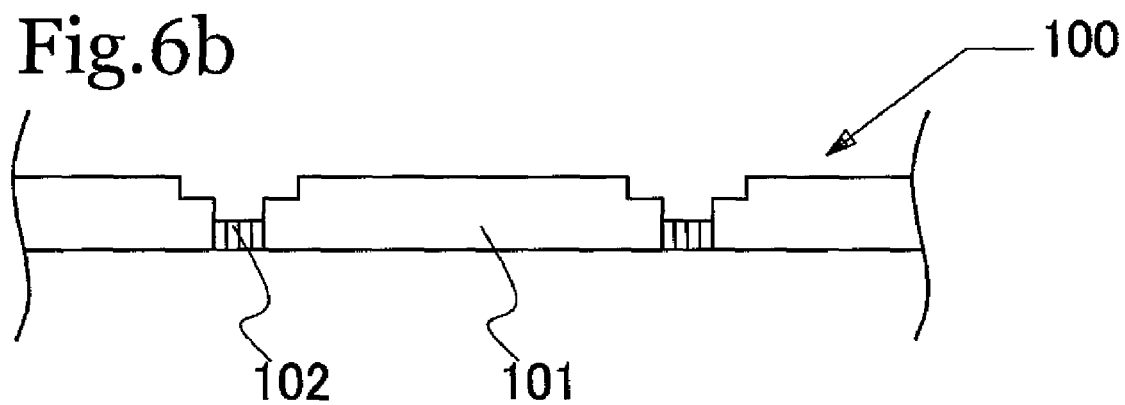
Figure 6C:
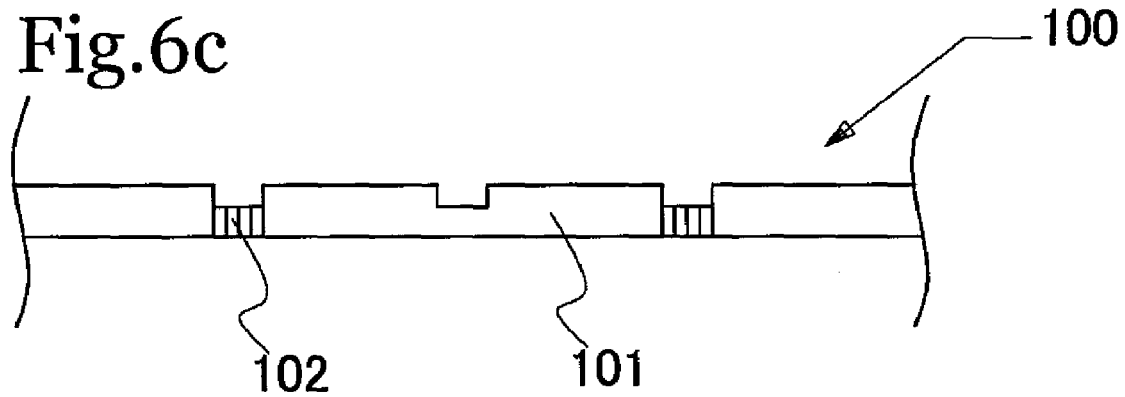

That is, in addition to the configuration shown in FIG. 1b, the recesses may be formed just in the high dislocation density regions 102 of the nitride semiconductor substrate as shown in FIG. 6a, or may be formed in a stepped pattern as shown in FIG. 6b. Also, as shown in FIG. 6c, if recesses are also formed in the low dislocation density regions, then stress can be further reduced in the nitride semiconductor substrate.

To form the recesses 103, a method in which a protective film is formed as a mask pattern, and chemical etching is performed, or a method in which physical etching is performed, can be utilized as desired.

Chemical etching makes use of different etching rates by an etching solution for the high dislocation density regions 102 and the low dislocation density regions 101 of the nitride semiconductor substrate, and the selection ratio of dry etching, etc. The etching solution can be, for example, a mixture of sulfuric acid and phosphoric acid, a BHF (buffered hydrofluoric acid) aqueous solution, another acid solution, or the like. This solution may be used after first being heated to between 100 and 300° C. The recesses are formed by immersing a wafer in this solution.

Wet etching with a mask pattern may also be utilized.

With physical etching, first a mask is formed on the surface of a GaN substrate. This mask can be $SiO_2$, SiN, $Al_2O_3$ or another such insulating film, a resist film, or a metal film, The pattern of this mask has openings that allow the above-mentioned recesses 103 to be formed. These openings are formed over the high dislocation density regions 102.

For instance, with a GaN substrate in which the low dislocation density regions 101 and high dislocation density regions 102 are formed in alternating stripes, the openings are also in the form of stripes. If a GaN substrate has the low dislocation density regions 101 and high dislocation density regions 102 formed in alternating stripes, then, for example, the mask stripes may be formed in a width of 50 to 500 μm over the low dislocation density regions 101 of the GaN substrate, the openings may be formed over at least the high dislocation density regions 102, the width of the openings is 5 to 100 μm, and they are formed in a striped pattern.

The mask may be thick enough to allow the recesses 103 to have the desired depth, such as 0.1 to 2 μm, and preferably 0.3 to 2 μm. The mask may be formed by CVD method, vapor deposition, sputtering or the like.

Next, the GaN substrate in which is formed a mask having openings over at least the high dislocation density regions 102 is selectively etched by RIE (Reactive Ion Etching). The gas used for etching may be one that contains chlorine, such as $Cl_2$, $CCl_4$, $CHCl_3$, $SiCl_4$, $BCl_3$, or the like. As to the etching conditions, $Cl_2$ gas is used at a gas pressure of 20 to 200 mTorr, for example, and preferably 80 to 120 mTorr. The gas flux is 10 to 200 sccm, and preferably 30 to 100 sccm. An example of the gas flux is 50 sccm or less. The plasma excitation power is 50 to 1000 W, and preferably 200 to 500 W, and the etching rate is 0.1 to 2.0 μm/min, and preferably 0.10 to 1.25 μm/min.

The protective film is then removed. The result is that striped recesses, for example, are formed in at least the high dislocation density regions 102. The spacing width between the recesses is 100 to 500 μm.

The depth of the recesses 103 shall be such that recesses can be formed in the first nitride semiconductor layer 110 and the second nitride semiconductor layer 120 that are formed on the nitride semiconductor substrate 100. More specifically, this depth may be 0.5 to 3 μm.

The width of the recesses 103 is from 5 to 100 μm, although it will depend on the width of the high dislocation density regions 102.

If the side faces of the recesses 103 are the low dislocation density regions 101, then the removed width of the low dislocation density regions 101 on both sides of the high dislocation density regions 102 is no more than 40 μm, and preferably 5 to 25 μm. If the low dislocation density regions 101 are removed within this range, then the first nitride semiconductor layer that is formed later can be easily formed in the desired growth film thickness ratio.

Keeping the side faces of the recesses 103 at least 5 μm, and preferably at least 7 μm away from the ends of the high dislocation density regions suppresses the propagation of dislocations from the nitride semiconductor substrate to the nitride semiconductor layer.

The tilt angle of the side faces of the recesses 103 is at least 60° and preferably at least 80°.

Next, a nitride semiconductor layer is formed by vapor deposition over the nitride semiconductor substrate in which the recesses 103 have been formed.

In the present invention, the nitride semiconductor layer may have a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As. The n-type nitride semiconductor layer may doped with at least one n-type impurity of IV or VI group elements, such as Si, Ge, Sn, S, O, Ti, Zr, Cd etc. and the p-type nitride semiconductor layer may doped with at least one p-type impurity, such as Mg, Zn, Be, Mn, Ca, Sr etc. The doped concentration is, for example, about $5 \times 10^{16}/cm^3$ to about $5 \times 10^{21}/cm^3$. All of layers in the n-type or p-type nitride semiconductor layers may not necessarily contain n-type or p-type impurity.

The nitride semiconductor layer can be formed by means of any known method which can grow these nitride semiconductor layers, such as MOVPE (Metal Organic Vapor Phase Epitaxy), MOCVD (Metal Organic Chemical Vapor Deposition), HVPE (Hydride Vapor Phase Epitaxy), MBE (Molecular Beam Epitaxy), or the like. In particular, MOCVD is preferable because it allows the nitride semiconductor to be growth with good crystallinity. The nitride semiconductor is preferably grown by suitably selecting one of various methods for the growth of a nitride semiconductor according to the intended use.

First, as shown in FIG. 1c, the first nitride semiconductor layer 110 is formed on the nitride semiconductor substrate in which the recesses 103 have been formed.

This first nitride semiconductor layer is formed, as shown in FIG. 1c' which is a further enlarged view of FIG. 1c, in which the grown film thickness Y in the lateral direction from the side faces of the recesses in the substrate is greater than the grown film thickness X in the heightwise direction from a region other than the recesses.

As to the specific conditions for forming this first nitride semiconductor layer 110, the inside of the reaction chamber is under reduced pressure, rather than normal pressure, during growth. It is also preferable for the growth to be conducted at 1050° C. or higher.

The grown film thickness X of the first nitride semiconductor layer 110 in the heightwise direction is 5 μm or less, and preferably 3 μm or less. In contrast, the grown film thickness Y in the lateral direction from the side faces of the recesses in the substrate is at least 5 μm, and preferably at least 5 μm and 25 μm or less. There are no particular restrictions on the thickness Z of growth in the heightwise direction from the bottom face of the recesses, but the thickness Z may be, for example, about the same as or less than the above-mentioned grown film thickness X.

As shown in FIG. 1c″, which is a further enlarged view, when the first nitride semiconductor layer is grown in the lateral direction, dislocations 106 are generated in a direction perpendicular to the <0001> direction of crystal orientation. Examples of a direction perpendicular to the <0001> direction of crystal orientation are the <11-20> direction, <1-100> direction, or the like. When dislocations are generated in the crystal orientation in the region of growth in the lateral direction, the strain to which the crystals are subjected can be divided up and stored in these dislocation portions. Furthermore, the greater is the width of the growth region in the lateral direction, and the greater is the ratio Y/X of the relationship Y >X between the grown film thickness Y in the lateral direction and the grown film thickness X in the heightwise direction, the greater is the effect of suppressing strain.

The first nitride semiconductor layer 110 is a nitride semiconductor layer that has a different lattice constant from that of the nitride semiconductor substrate 100, and that preferably contains aluminum. This allows dislocations to be formed discontinuously in the crystal orientation, so the effect of suppressing strain is even better. Also, if the nitride semiconductor substrate 100 contains aluminum, the aluminum mixed crystal ratio of the first nitride semiconductor layer 110 is varied so that the first nitride semiconductor layer 110 and the nitride semiconductor substrate 100 will have different lattice constants. The first nitride semiconductor layer 110 gives priority to growth in the lateral direction over growth in the heightwise direction on the nitride semiconductor substrate, and an example of the conditions thereof is to grow under reduced pressure conditions (below normal pressure) using MOCVD.

Recesses 104 are formed on the surface of the first nitride semiconductor layer 110 above the recesses 103 of the nitride semiconductor substrate 100. Dislocations that propagate from the high dislocation density regions 102 of the nitride semiconductor substrate can be converged within the recesses 104 of the first nitride semiconductor layer. The tilt angle of the side faces of these recesses 104 is preferably smaller than the tilt angle of the recesses 103 formed in the nitride semiconductor substrate 100. This allows dislocations to be converged more selectively within the recesses 104.

The first nitride semiconductor layer 110 is a nitride semiconductor layer that contains aluminum, and that is expressed by the general formula $Al_xGa_{1-x}N$ ($0 \leq x \leq 1$). A buffer layer expressed by the general formula $In_aAl_bGa_{1-a-b}N$ ($0 \leq a \leq 1$, $0 \leq b \leq 1$) and a patterned metal layer may be interposed between the nitride semiconductor substrate 100 and the first nitride semiconductor layer 110, provided that dislocations in the nitride semiconductor substrate do not propagate to the nitride semiconductor layer widely.

The thickness of the first nitride semiconductor layer 110 is 0.1 μm to 4 μm, and preferably 0.4 μm to 2.5 μm.

After this, as shown in FIG. 1d, the second nitride semiconductor layer 120 is formed on the first nitride semiconductor layer 110. This second nitride semiconductor layer 120 is a nitride semiconductor layer that contains indium. Preferably, it is expressed by the general formula $In_xGa_{1-x}N$ ($0 < x \leq 1$). It is believed that dislocations are present in the first nitride semiconductor layer, which is the layer beneath the second nitride semiconductor layer, and that a very slight temperature distribution is generated in this portion. Accordingly, if a very slight indium distribution variance is generated within the nitride semiconductor layer containing indium that is grown over the first nitride semiconductor layer grown in the lateral direction, this variation in the indium distribution will more effectively divide up the tensile strain and suppress the development of cracks. This nitride semiconductor layer containing indium may serves as a buffer layer in the in-plane direction. The effect of the above constitution is that cracks are less likely to develop in the layer grown over the second nitride semiconductor layer 120. The first nitride semiconductor layer may serves as a clad layer, then the second nitride semiconductor layer may serves as an active layer containing indium.

Also, recesses 105 are formed on the surface of the second nitride semiconductor layer 120 over the recesses 103 of the nitride semiconductor substrate. Tensile strain generated between the nitride semiconductor substrate and the nitride semiconductor layer by forming the first nitride semiconductor layer 110 on the nitride semiconductor substrate 100 in which the recesses 103 have been formed, and forming on this a nitride semiconductor layer containing indium, can be divided up by the recesses 105 in the second nitride semiconductor layer 120. If tensile strain is continuously present in the nitride semiconductor substrate and in the nitride semiconductor layer grown thereon, cracks will tend to form upon completion of the crystal growth and in the subsequent design steps, but since the tensile strain can be divided up by the above configuration, cracking in the subsequent design steps can be suppressed. It is believed that the nitride semiconductor layer containing indium and capable of lessening tensile strain will have a greater effect if its surface area is greater in the flat direction. That is, it is believed that a wider growth area of the second nitride semiconductor layer 120 formed on the growth region (lateral grown film thickness Y) in the lateral direction of the first nitride semiconductor layer 110 shown in FIG. 1c will have a better effect of lessening tensile strain. Tensile strain can be divided up even more effectively by generating dislocations in the lateral direction of the nitride semiconductor layer containing aluminum, which is the underlying layer.

The film thickness the second nitride semiconductor layer may be about 0.05 μm to 0.3 μm.

The suitable conditions for forming the second nitride semiconductor layer include, for example, a growth temperature of at most 1000° C. under a condition of a normal atmospheric pressure in a reaction chamber.

After this, as shown in FIG. 1e, a third nitride semiconductor layer 130 is formed on the second nitride semiconductor layer 120. This third nitride semiconductor layer 130 does not need to have recesses passed on from the underlying layer, and may be flat. The third nitride semiconductor layer 130 can function as a clad layer. In this case, there is no need for an n-side clad layer to be provided separately. If the second nitride semiconductor layer serves as an active layer, the third nitride semiconductor layer may serves as a p-side nitride semiconductor layer.

Alternatively, with the present invention, the nitride semiconductor layers on the nitride semiconductor substrate, all the way to the third nitride semiconductor layer 130 formed from the substrate side, will may be referred to as underlayers. These base layers may contain n-type impurities or p-type impurities, although they are n-type nitride semiconductor layers in this embodiment.

The third nitride semiconductor layer 130 is $Al_xGa_{1-x}N$ (0<x≦0.5), and preferably $Al_xGa_{1-x}N$ (0<x≦0.3).

Specific growth conditions include a growth temperature of at least 950° C. under a normal atmospheric pressure in a reaction chamber.

The film thickness of the third nitride semiconductor layer 130 may be about 0.01 to 5 μm, and preferably about 0.5 to 5 μm.

Next, the steps for manufacturing the nitride semiconductor laser element pertaining to this embodiment will be described. The present invention is not, however, limited to the following constitution. FIG. 2 is a simplified cross section of a nitride semiconductor laser element formed under the following conditions.

First Step

Firstly, the nitride semiconductor substrate 100 described above is provided.

Second Step

Next, the recesses 103 are formed in the semiconductor substrate 100 described above.

Third Step

The first nitride semiconductor layer, the second nitride semiconductor layer and the third nitride semiconductor layer are formed on the surface of the nitride semiconductor substrate 100a, described above. For example, an underlayer (an n-type nitride semiconductor layer) is formed on the surface of the nitride semiconductor substrate 100a, n-type nitride semiconductor layers, and optionally, a core layer including an active layer, and p-type nitride semiconductor layers are formed thereon. These layers may be formed by MOCVD method under a condition of a reduced pressure to atmospheric pressure.

The n-type semiconductor layer 201 is formed on the third n-type semiconductor layer. This n-type nitride semiconductor layer may be $Al_xGa_{1-x}N$ (0≦x≦0.3) or $In_xGa_{1-x}N$ (0≦x≦0.1) functioning as a light guide layer. The film thickness may be about 0.05 μm to 1 μm. The ntype semiconductor layer can be omitted.

It is also possible to employ a constitution in which an intermediate layer composed of $In_xAl_yGa_{1-x-y}N$ (0≦x≦1, 0≦y<1, 0<x+y≦1) is interposed between the n-type nitride semiconductor layers 201. The intermediate layer may have a single-layer structure or a multilayer laminated structure. The n-type nitride semiconductor layer may also have a superlattice structure composed of two layers with mutually different compositional ratios.

Then, a layer composed of a compound containing at least indium and expressed by the general formula $In_xAl_yGa_{1-x-y}N$ (0<x≦1, 0≦y<1, 0<x+y≦1) is formed as the active layer 205. This allows light to be emitted from 300 to 580 nm. Also, emission efficiency will be higher if the active layer is formed with a quantum well structure. The well layer has composition a ratio of indium in the mixed crystal of 0<x≦0.4, aluminum of 0≦x<0.3. The film thickness of the well layer is 10 Å to 200 Å, and preferably 30 Å to 100 Å. The barrier layer has composition a ratio of indium in the mixed crystal of 0≦x<0.5, aluminum of 0≦x<0.3. The film thickness of the barrier layer is 20 Å to 300 Å, and preferably 50 Å to 200 Å. When the active layer has a multiple quantum well structure, it may start from a barrier layer and end at a well layer, start from a barrier layer and end at a barrier layer, start from a well layer and end at a barrier layer, or start from a well layer and end at a well layer. Light can also be emitted in the ultraviolet band by having the barrier layer be a nitride semiconductor layer that contains aluminum. The active layer 205 may also be a single quantum well structure.

Next, a p-type nitride semiconductor layer is formed with a multilayer structure on the active layer 205.

The first p-type semiconductor layer 211 is $Al_xGa_{1-x}N$ (0≦x≦0.5) containing a p-type impurity. The first p-type semiconductor layer functions as a p-side electron confinement layer. The second p-type semiconductor layer 212 can be formed from $Al_xGa_{1-x}N$ (0≦x≦0.3), and the third p-type semiconductor layer 213 from $Al_xGa_{1-x}N$ (0<x≦0.5) containing a p-type impurity. The third p-type semiconductor layer preferably is a superlattice, and functions as a cladding layer. More specifically, an $Al_xGa_{1-x}N$ (0≦x<1) layer and an $Al_yGa_{1-y}N$ (0<y≦1,x<y) layer are alternately formed in a thickness of 100 Å or less. The fourth p-type semiconductor layer 214 can be formed from $Al_xGa_{1-x}N$ (0≦x≦1) containing a p-type impurity. The fourth p-type nitride semiconductor layer functions as a contact layer for an-electrode. If the third p-type semiconductor layer functions as a contact layer, the fourth p-type semiconductor layer can be omitted. Indium may also be mixed into these semiconductor layers as a mixed crystal. The thicknesses for each layer are 30 Å to 5 µm, respectively. The first p-type semiconductor layer and the second p-type semiconductor layer can be omitted.

It is preferable to perform annealing under a nitrogen atmosphere at a temperature of 700° C. or higher after the semiconductor layers have been formed in order to reduce resistance of the p-type nitride semiconductor.

Fourth Step

The wafer on which the nitride semiconductor layers have been laminated on the nitride semiconductor substrate 100 is taken out of the reaction chamber. Etching is performed from the p-type nitride semiconductor layer side to expose the n-type nitride semiconductor layer, or the underlayers, or the nitride semiconductor substrate. The width of the nitride semiconductor layers with this etching may be from 100 to 500 µm. There are no particular restrictions on the location of the exposed face, but in this embodiment the wafer is exposed down to the third nitride semiconductor layer 130. This has the effect of lessening stress. This step can be omitted. Simultaneously with this etching, a W-shaped groove may be formed on the surface of the p-type nitride semiconductor layer, near the end face on the light emission side. The emission of stray light from the end face can be suppressed by this W groove. Also, cleavage assisting grooves may be formed at the four corners of the element simultaneously with this etching. These cleavage assisting grooves make it easier to separate the wafer into bars or chips. The etching is performed by RIE, and using a chlorine-based gas such as $Cl_2$, $CCl_4$, $CHCl_3$, $BCl_3$, $SiCl_4$.

Next, a ridge is formed in a striped pattern on the p-type nitride semiconductor layer. The width of the ridge, which is a waveguide region, may be from 1.0 to 30.0 µm. The ridge width in the case of a single mode laser beam is preferably from 1.0 to 3.0 µm. The height of the ridge (the etching depth) may be sufficient to expose at least a third p-type nitride semiconductor layer 213, and all the way to a first p-type nitride semiconductor layer 211 may be exposed.

After this, a first insulating film 220 is formed on the exposed face of the p-type nitride semiconductor layer. The first insulating film 220 is preferably formed on the side faces of the ridge. This first insulating film 220 can be selected from among insulating materials whose refractive index is lower than that of the nitride semiconductor layers. Examples of the material of the first insulating film 220 includes oxides or nitrides of Zr, Si, V, Nb, Hf, Ta, Al and other such oxides or nitrides. The first protective film can be formed a multilayer film which is laminated combining the above-mentioned material.

Thereafter, a p-electrode 230 is formed on the surface of the fourth p-type nitride semiconductor layer 214. It is preferable that the p-electrode 230 be formed only on the fourth p-type nitride semiconductor layer 214. The p-electrode has a multilayer structure. For example, when it has a two-layer structure containing Ni and Au, Ni is formed on the fourth p-type nitride semiconductor layer having a film thickness of about 50 Å to about 200 Å, and Au is formed having a film thickness of about 500 Å to about 3000 Å. Also, when the p-electrode has a three-layer structure, Ni—Au—Pt or Ni—Au—Pd is formed in such order. The Ni and Au may have a film thickness equivalent to that of a two-layer structure, and the Pt or Pd that is the last layer has a thickness of about 500 Å to about 5000 Å. Examples of the other p-electrode include Pd—Mo—Au, Pd—Pt—Au, Pd—Au or the like.

After the p-electrode 230 is formed, ohmic annealing may be performed. With regard to specific annealing condition, the annealing temperature may be at least 300 ° C., preferably at least 500° C. Another condition is that the annealing atmosphere contains nitrogen and/or oxygen. The method for forming the p-electrode or other electrode in the present invention which is not limited includes spattering, CVD method or the like.

Next, a second insulating film 240 is formed on the side faces of the exposed n-type nitride semiconductor layer formed prior step. Examples of the second insulating film may be formed by $ZrO_2$, $SiO_2$, $PbO$, $TiO_2$, $CeO_2$, $HfO_2$, $Al_2O_3$, $Bi_2O_3$, $Cr_2O_3$, $In_2O_3$, $Nd_2O_3$, $Sb_2O_3$, $Ta_2O_5$, $Y_2O_3$, $AlF_3$, $BaF_2$, $CeF_2$, $CaF_2$, $MgF_2$, $NdF_3$, $PbF_2$, $SrF_2$, ZnS, ZnSe, and other oxides or nitrides of V, Nb, Hf, Ta, Al and the like. This second insulating film may be a multilayer film which is not limited to a single film and laminated in combination with the above-mentioned material.

Thereafter, a p-pad electrode is formed on the p-electrode. This pad electrode is preferably a laminate composed of Ni, Ti, Au, Pt, W, or another such metal. More specifically, the pad electrode may be formed by forming W—Pd—Au, Pt—Ti—Au, Ni—Ti—Au, Ni—Pd—Au or the like in that order, starting from the p-electrode side. There are no particular restrictions on the thickness of the pad electrode, but the thickness of the gold film that serves as the final layer is preferably at least 1000 Å.

Fifth Step

After this, an n-electrode 232 is formed on a second main face 100*b* of the nitride semiconductor substrate. The step of forming the n-electrode 232 involves first polishing the substrate from its second main face side, so that the thickness of the substrate is reduced to about 200 µm or less. Then, an n-electrode is formed in multiple layers by sputtering or the like. The n-electrode may be formed by metal alloy of laminated structure selected from the group consisting of V, Mo, Ti, Cr, W, Al, Zr, Au, Pd, Rh, Nb, Hf, Ta, Re, Mn, Zn, Pt, Ru. It is preferably V—Pt—Au, Ti—Pt—Au, Mo—Pt—Au, W—Pt—Au, Ti—Pd—Al, Ti—Al, Cr—Au, W—Al, Rh—Al, Hf—Al, Hf—Al—Mo—Au, Hf—Al—Pt—Au, Hf—Al—W—Au, Hf—Au, Hf—Mo—Au or the like in this order, and is considered as two-layer structure or three-layer structure. Ti, Mo, Si, W, Pt, Ni, Rh, or an oxide or nitride thereof may be laminated over the surface of the n-electrode to act as a barrier. These enhance the mounting strength of the chip.

The n-electrode is formed in a thickness of about 100 Å using vanadium for the first layer, for example. The second layer is formed in a thickness of about 2000 Å using platinum, and the third layer is formed in a thickness of about 3000 Å using gold. These may be formed by CVD, vapor deposition, or another such method in addition to sputtering. After the n-electrode has been formed, it may be annealed at 500° C. or higher.

After forming the n-electrode 232, a metallized electrode may also be formed on the n-electrode. This metallized electrode may be formed from, for example, Ti—Pt—Au—(Au/Sn), Ti—Pt—Au—(Au/Si), Ti—Pt—Au—(Au/Ge), Ti—Pt—Au—In, Au—Sn, In, Au—Si, Au—Ge, or the like.

After the n-electrode 232 is formed, the nitride semiconductor layer is divided into bars in a direction perpendicular to the striped p-electrode 230, so that the length of the resonator will be about 200 to about 1500 µm, thereby forming a cavity (resonator) end face. The direction of the cavity is arranged in parallel with an extending direction of the high dislocation density region of the substrate. The cavity end face here is the M plane (1-100) or A plane (11-20). Methods for dividing the wafer into bars include blade breaking, roller breaking, and press breaking.

Sixth Step

A dielectric film is then formed over the cavity end face. After the dielectric film has been formed on the cavity end face of a bar-shaped semiconductor, chips are produced from this bar to form nitride semiconductor laser elements. The nitride semiconductor laser elements have a rectangular shape after being made into chip, and the cavity length of this rectangular shape is about 1500 µm or less.

The result of the above is that a nitride semiconductor laser element obtained with the constitution discussed above will have no cracks, or fewer cracks, in the crystal growth step and design step and during drive. Consequently, in a service life test (Tc=25° C., output of 50 mW at CW) at an oscillation wavelength of 375 nm, operation of at least 3000 hours is possible. Also, the COD level is 300 mW or higher, and the Kink power is 100 mW or higher.

In addition to these, the nitride semiconductor laser element of the present invention having an opposed electrode structure and reducing contact resistance will be contact resistivity of $1.0 \times 10^{-3}$ $\Omega cm^2$ or less.

Embodiment 2

This nitride semiconductor laser element comprises a nitride semiconductor substrate which has a high dislocation density region and a low dislocation density region containing dislocation density lower than that of the high dislocation density region, and a nitride semiconductor layer laminated thereon, at least one recess is formed at least in the high dislocation density region. The nitride semiconductor layer has a first nitride semiconductor layer in which the grown film thickness in the lateral direction from the side faces of the recess in the substrate is greater than the grown film thickness in the heightwise direction from a region other than the recess. The dislocations extending in the in-plane direction are present in the region of growth of the first nitride semiconductor layer in the lateral direction. Structure and manufacture conditions other than this can be made to be the same as that of the Embodiment 1. Also, a dislocation extending in the in-plane direction may be present in the region of the layers other than the first nitride semiconductor layer.

This laser element has a first nitride semiconductor layer on the nitride semiconductor substrate in which recesses have been formed. This first nitride semiconductor layer is such that the grown film thickness in the lateral direction from the side faces of the recesses in the substrate is greater than the grown film thickness in the heightwise direction from regions other than the recesses, and there are dislocations extending in the in-plane direction in the growth region in the lateral direction of the first nitride semiconductor layer. Dislocations extending in the in-plane direction can exhibit the effect discussed above by having at least $1 \times 10^8$ dislocations/cm$^2$, and preferably $1 \times 10^8$ dislocations/cm$^2$ to $1 \times 10^{11}$ dislocations/cm$^2$, and more preferably $1 \times 10^8$ dislocations/cm$^2$ to $1 \times 10^{10}$ dislocations/cm$^2$. The tensile strain that occurs on a wafer surface can be suppressed, particularly in the step of etching the wafer.

Dislocations extending in the in-plane direction of the nitride semiconductor layer are preferably not over the entire surface of the first nitride semiconductor layer, and instead extend in the in-plane direction of just the growth region in the lateral direction. There are no particular restrictions on the length of the dislocations extending in the in-plane direction, but about 0.1 to about 1.5 µm or about 0.3 to about 1.5 µm is preferable. Within this range, dislocations that would affect the characteristics of the laser element will not propagate to other regions, and the tensile strain that occurs on the wafer surface can be suppressed.

The nitride semiconductor substrate used in this laser element is preferably one in which the dislocation density of the substrate surface is no more than $1 \times 10^7$/cm$^2$. The entire nitride semiconductor substrate surface may have a dislocation density within this range, but usually the low dislocation density region of a substrate having both a high dislocation density region and a low dislocation density region has a dislocation density within this range.

Embodiment 3

This nitride semiconductor laser element comprises a nitride semiconductor substrate having the dislocation density of no more than $1 \times 10^7$/cm$^2$ at the substrate surface, and at least one recess is formed in the substrate surface. The nitride semiconductor layer has a first nitride semiconductor layer in which the grown film thickness in the lateral direction from the side faces of the recesses in the substrate is greater than the grown film thickness in the heightwise direction from a region other than the recess. The dislocations extending in the in-plane direction are present in the region of growth of the first nitride semiconductor layer in the lateral direction, the density of these the dislocations extending in the in-plane direction in the region of growth of the first nitride semiconductor layer in the lateral direction is at least $1 \times 10^8$/cm$^2$. Structure and manufacture conditions other than this can be made to be the same as that of the Embodiments 1 and 2.

The dislocations extending in the in-plane direction is the same as described above.

In these teaser element of the Embodiments 2 and 3, it is preferable that the first nitride semiconductor layer has a recess on the recess formed in the nitride semiconductor substrate, the first nitride semiconductor layer is preferably a nitride semiconductor layer that contains aluminum, and preferably has a second nitride semiconductor layer that is disposed on the first nitride semiconductor layer and contains indium, like the Embodiment 1.

Embodiment 4

This nitride semiconductor laser element is formed a nitride semiconductor layer interposed between the first nitride semiconductor layer and the nitride semiconductor substrate as described in Embodiment 1.

This nitride semiconductor layer may be formed on the nitride semiconductor substrate other than a region formed recesses, the first nitride semiconductor layer may be formed in the recesses.

This nitride semiconductor laser element may be formed as follows.

Figure 8A:
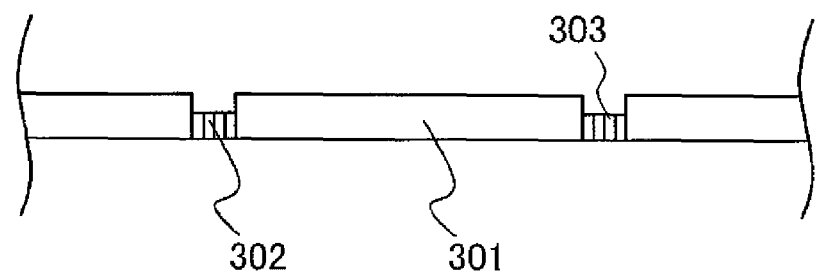
FIGS. 8a to 8c is a schematic cross-sectional view showing a manufacturing a nitride semiconductor laser device according to the present invention.
Figure 8B:
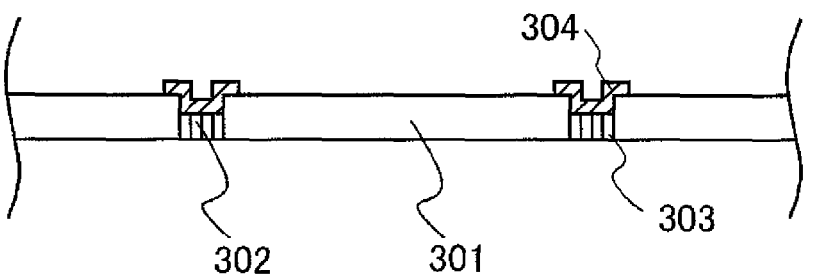

First, as shown in FIG. 8a, the nitride semiconductor substrate having recesses 303 on the surface is provided, and then, as shown in FIG. 8b, a protective film 304 is formed so as to cover the recesses 303 and their adjacent region. The protective film may be formed by the materials exemplified as the first and second insulating film, and by patterning using any known methods.

Figure 8C:
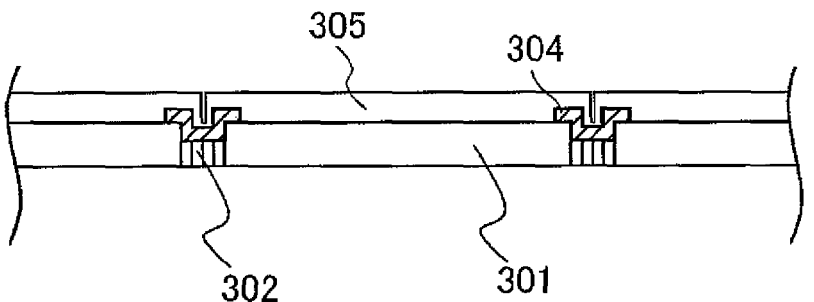

As shown in FIG. 8c, the nitride semiconductor layer 305 is formed thereon. This nitride semiconductor layer 305 is the same material exemplified as the first nitride semiconductor layer, and there are no particular restrictions on the thickness, but the thickness may be suitably adjusted according to the width or the like of the recesses.

Figure 8D:
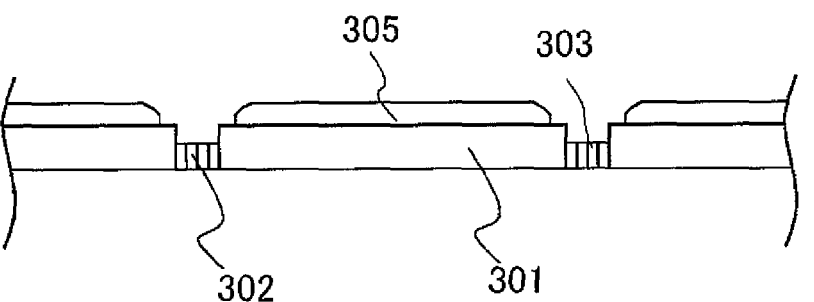
Figure 8E:
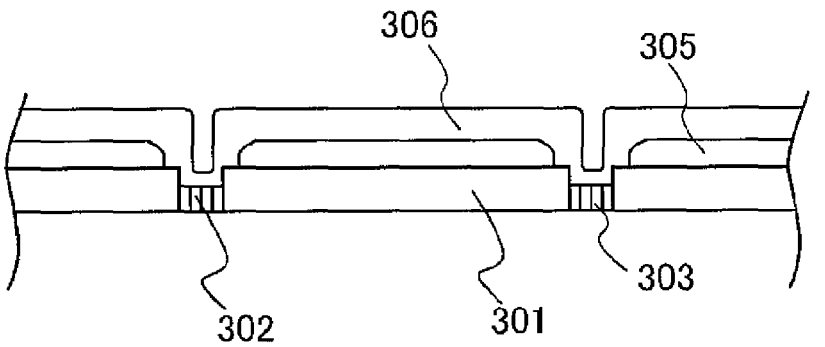
Figure 9:
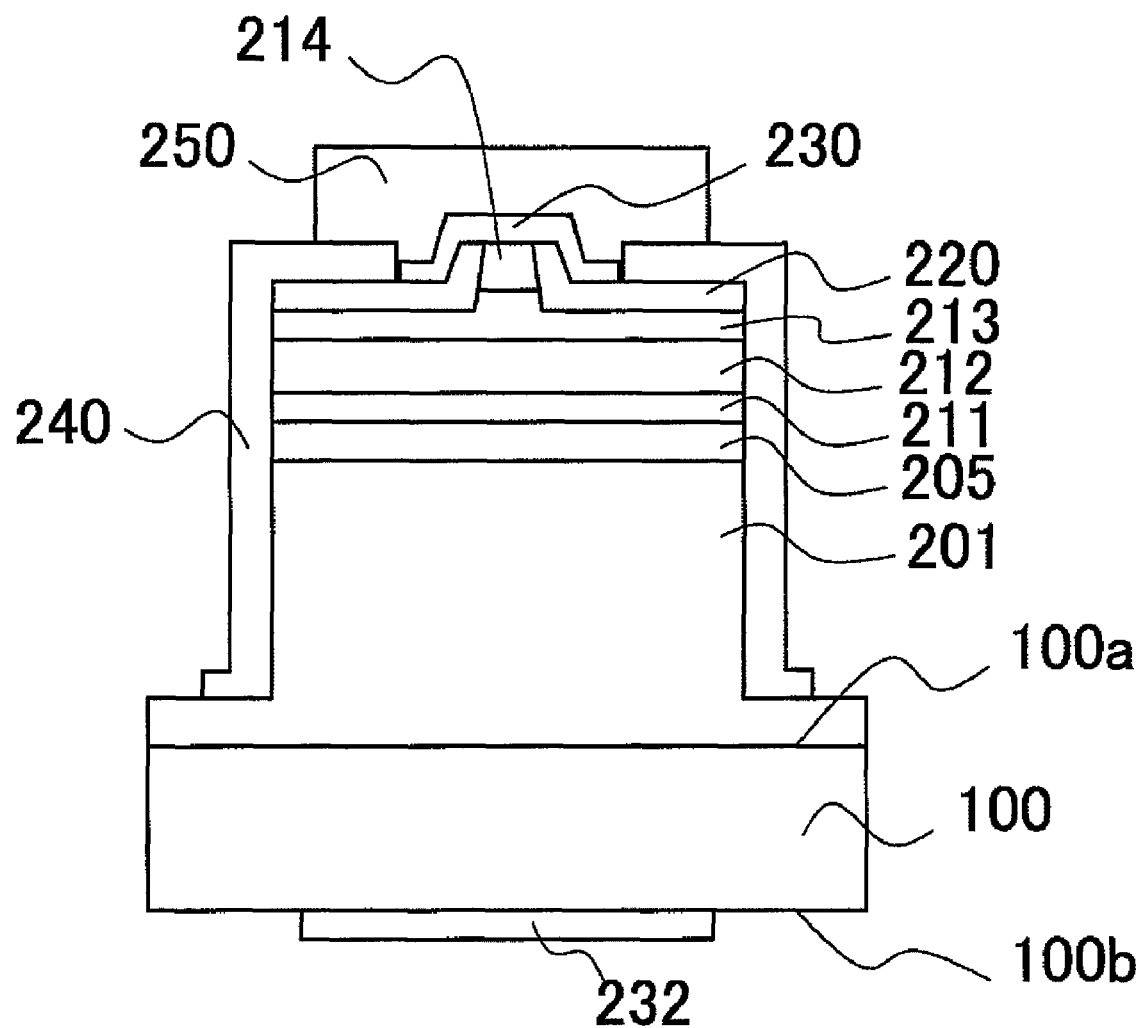
FIG. 9 is a schematic cross-sectional view showing a nitride semiconductor laser device according to prior art.

Thereafter, as shown in FIG. 8d, the protective film is removed by lift-off method. As shown in FIG. 8e, the first nitride semiconductor layer is formed on the nitride semiconductor layer which can be made to be the same as that of the Embodiment 1.

This manufacturing method makes it possible to reduce the contamination into the active layer, since the active layer has not been formed under the condition that the protective film is exist, and the protective film is not exist at forming the active layer on the first nitride layer.

This manufacturing method makes it possible to reduce the contamination generated from the protective film into the active layer, since the protective film is removed in forming active layer on the first nitride layer.

Examples of the present invention will now be given, but the present invention is not limited to or by the following Examples, and various modifications are possible based on the technological concept of this invention.

Example 1

The substrate here is a wafer-shaped GaN substrate 100 whose main face is the C plane. With this GaN substrate, high dislocation density regions with a width of 50 μm or less and low dislocation density regions with a width of 200 μm or more are formed in alternating stripes.

Next, the recesses 103 are formed on the front side 100a of the GaN substrate 100.

A mask pattern composed of $SiO_2$ is formed. The mask is formed in the low dislocation density regions, and the high dislocation density regions served as the openings in the mask. After this, etching is performed with $Cl_2$ gas by RIE, forming the recesses 103 with a width of 60 μm and a depth of 2.5 μm. The side faces of the recesses are at least 5 μm away from the ends of the high dislocation density regions.

The GaN substrate in which the recesses had been formed is transported to an MOCVD apparatus.

A first nitride semiconductor layer 110 is formed on the GaN substrate. The temperature is set to 1000° C. in a reaction chamber under reduced pressure, and TMA (trimethylaluminum), TMG (trimethylgallium) and ammonia ($NH_3$) are employed, and silane gas is employed as an impurity gas to grow the first nitride semiconductor layer composed of $Al_{0.02}Ga_{0.98}N$ doped with Si (film thickness: 2.0 μm).

A second nitride semiconductor layer 120 is formed on the first nitride semiconductor layer 110. The temperature is set to 1000° C. or less in the reaction chamber under a normal pressure, and TMI, TMG and ammonia are employed, and silane gas is employed as an impurity gas to grow the second nitride semiconductor layer composed of $In_{0.05}Ga_{0.95}N$ doped with Si (film thickness: 0.15 μm).

A third nitride semiconductor layer 130 is formed on the second nitride semiconductor layer 120. The temperature is set to 1000° C. in the reaction chamber under a normal pressure, and TMA, TMG and ammonia are employed, and silane gas is employed as an impurity gas to grow the third nitride semiconductor layer composed of $Al_{0.10}Ga_{0.90}N$ doped with Si (film thickness: 0.8 μm).

A nitride semiconductor layer 201 is formed on the third nitride semiconductor layer 130. The temperature is the same, and TMA, TMG and ammonia are employed to grow the nitride semiconductor layer 201 composed of undoped $Al_{0.05}Ga_{0.95}N$ (film thickness 0.15 μm). This layer may be doped with n-type impurity.

Next, the temperature is set to 950° C., and TMI, TMA, TMG, and ammonia are employed, and silane gas is employed as an impurity gas to grow a barrier layer composed of $Al_{0.15}Ga_{0.85}N$ doped with Si (film thickness: 80 Å). Then, the silane gas is stopped, and an undoped well layer composed of $In_{0.02}Ga_{0.98}N$ is grown (film thickness: 150 Å). Finally, a barrier layer composed of $Al_{0.15}Ga_{0.85}N$ doped with Si (film thickness: 60 Å), thus an active layer having a single quantum well structure (SQW, total film thickness: 290 Å).

A first p-type semiconductor layer 211 having two layers is formed, in which this layer is composed of $Al_{0.25}Ga_{0.75}N$ doped with Mg (film thickness: 30 Å) formed under nitrogen atmosphere, and $Al_{0.30}Ga_{0.70}N$ doped with Mg (film thickness: 100 Å) formed under hydrogen atmosphere.

The temperature is set to 1050° C., and TMG and ammonia are employed to grow a second p-type semiconductor layer 212 composed of undoped $Al_{0.05}Ga_{0.95}N$ is grown (film thickness: 0.1 μm).

Thereafter, an A layer composed of undoped $Al_{0.14}Ga_{0.86}N$ (80 Å thick) is grown, and then a B layer composed of $Al_{0.06}Ga_{0.94}N$ doped with Mg (80 Å thick) is laminated thereon. The A layer and the B layer are alternately laminated, and this process is repeated 28 times to grow an third p-type semiconductor layer 213 composed of a multilayer film (superlattice structure) with a total thickness of 0.45 μm.

Finally, a forth p-type semiconductor layer 214 composed of GaN doped with Mg is grown (film thickness: 150 Å) at the temperature of 1050° C. on the surface of the third p-type semiconductor layer 213.

After this reaction, the wafer is annealed in the reaction chamber in a nitrogen atmosphere and at a temperature of about 700° C. so as to lower the resistance of the p-type semiconductor layer.

A wafer comprising a nitride semiconductor layer laminated on the GaN substrate, as described above, is taken out of the reaction chamber, and a protective film composed of $SiO_2$ is formed on the surface of the uppermost layer of the fourth p-type semiconductor layer 214. RIE is then used to etch with $Cl_2$ gas as an etching gas to expose the surface of the third p-type nitride semiconductor layer 130.

Next, a ridge stripe is formed as the above-mentioned striped waveguide region. A mask layer composed of $SiO_2$ is formed in a thickness of 0.5 μm with a CVD apparatus over substantially the entire surface of the uppermost fourth p-type semiconductor layer 214. Thereafter, a stripe-shaped mask pattern is formed by using $CHF_3$ gas in an RIE apparatus. The semiconductor layer is etched using $Cl_2$ gas and $SiCl_4$ gas to form the ridge stripe above the active layer. The width of the ridge is 1.8 μm.

A first insulating film composed of $ZrO_2$ is formed in a thickness of approximately 2000 Å on the surface of a p-type semiconductor layer with an $SiO_2$ mask in place. This is immersed in a BHF (buffered hydrofluoric acid) aqueous solution to dissolve away the $SiO_2$ formed on the upper face of the ridge stripe, and the $ZrO_2$ on a fourth p-type semiconductor layer 214 is removed by lift-off along with the $SiO_2$. This exposed the upper face of the ridge, and the side faces of the ridge are covered with $ZrO_2$.

A p-electrode composed of Ni—Au is formed on the fourth p-type semiconductor layer. The thickness of the nickel is 100 Å, and the thickness of the gold is 1500 Å. After this the product is heat treated at 600° C. (this can be omitted).

Next, SiO$_2$ is formed as a second insulating film on the side faces of the laser element. Nickel, titanium, and gold are further formed in that order as a p-pad electrode over the p-electrode.

The GaN substrate is polished to adjust its thickness to approximately 85 μm, and the n-electrode 232 is formed, comprising vanadium, platinum, and gold laminated in that order in thicknesses of 100 Å, 2000 Å, and 3000 Å on the substrate rear side 100*b*.

Next, the wafer is broken by cleavage into bars. The cleavage face of the nitride semiconductor layer is the M plane (11-00 plane) of the nitride semiconductor, and this face served as the cavity face.

A dielectric film is provided to the end face on the light emission side of the nitride semiconductor bars thus formed.

The cavity face is cleaned using a plasma of an active gas such as oxygen and using an ECR sputtering apparatus at the end face on the light emission side (front end face), after which a dielectric film composed of Al$_2$O$_3$ is formed. The refractive index of this dielectric film is 1.66 with respect to light of 375 nm.

Next, a dielectric film composed of Al$_2$O$_3$ is formed to the end face on the light reflection side (rear end face), and then, a pair of SiO$_2$ and ZrO$_2$ are alternately repeated 4 times to form a reflective mirror.

After this, chips are produced from the semiconductor bars to form rectangular nitride semiconductor laser elements (see FIG. 2). The reference position for producing the chips is the high dislocation density regions present in the recesses and on both side faces. Producing chips at this position increases the yield in the chip production step. The cavity length is 600 μm, and the chip width is 400 μm.

The nitride semiconductor laser elements thus obtained underwent less cracking than those in a conventional example (FIG. 8) in which there are no recesses, first nitride semiconductor layer, or second nitride semiconductor layer, so the service life is over 3000 hours.

Also, the nitride semiconductor laser elements of this Example allow for continuous oscillation at an oscillation wavelength of 375 nm, a high output of 30 mW during CW drive, and a threshold current density of 3.5 kA/cm$^2$ at room temperature.

Example 2

Figure 3:
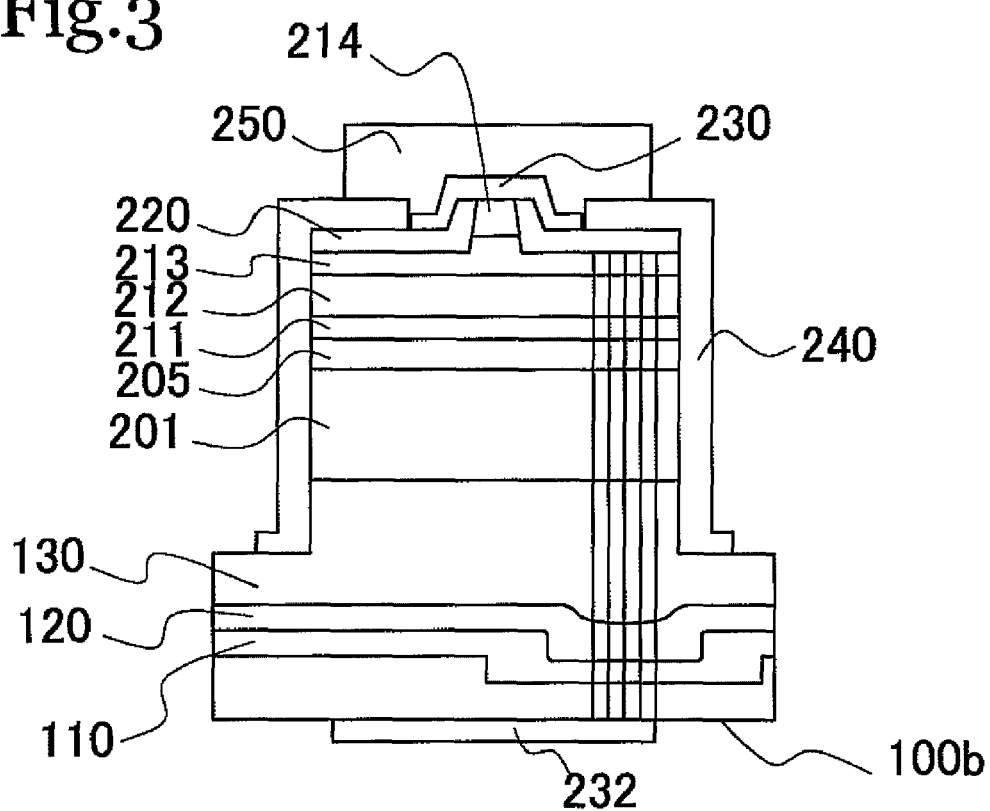
Figure 5:
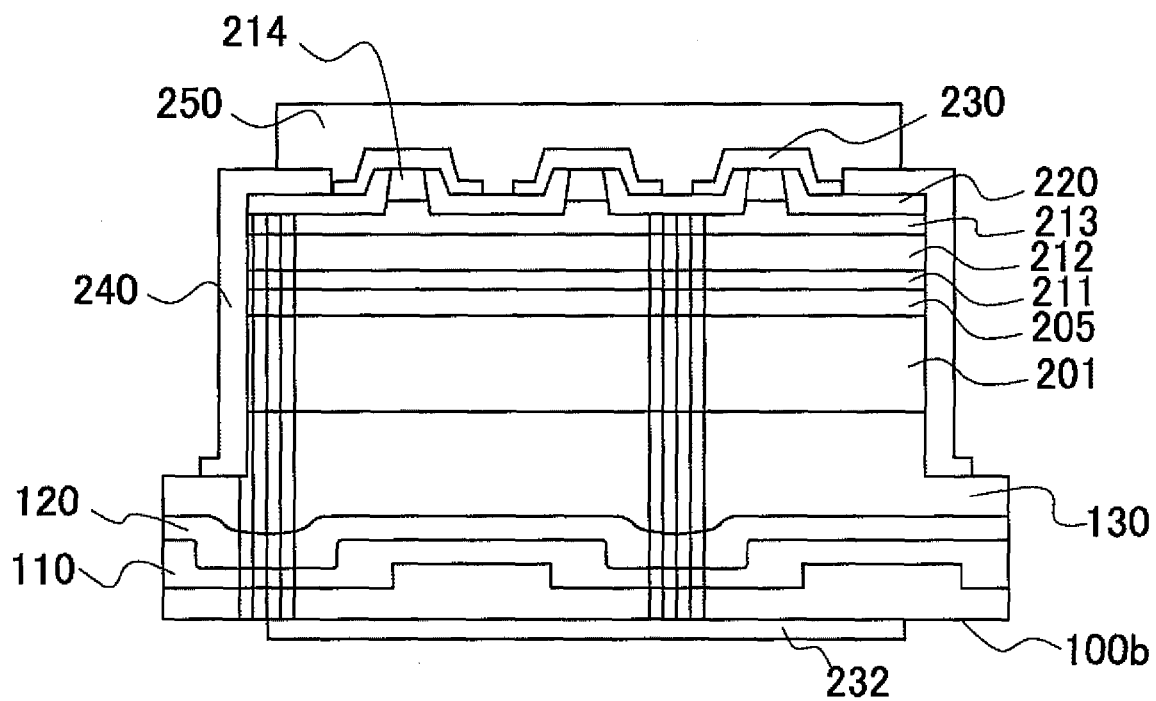

As opposed to Example 1, ridge stripes are formed away from the high dislocation density regions 102 (see FIG. 5). Also, in the step of producing chips from semiconductor bars, the reference position for producing the chips is the low dislocation density regions present in the recesses and on both side faces (see FIG. 3). Otherwise, nitride semiconductor laser elements are formed in the same manner as in Example 1.

The nitride semiconductor laser element obtained by this Example will have no cracks, or fewer cracks, in the crystal growth step and design step and during drive, whereby expecting excellent service life characteristics.

Example 3

Figure 4:
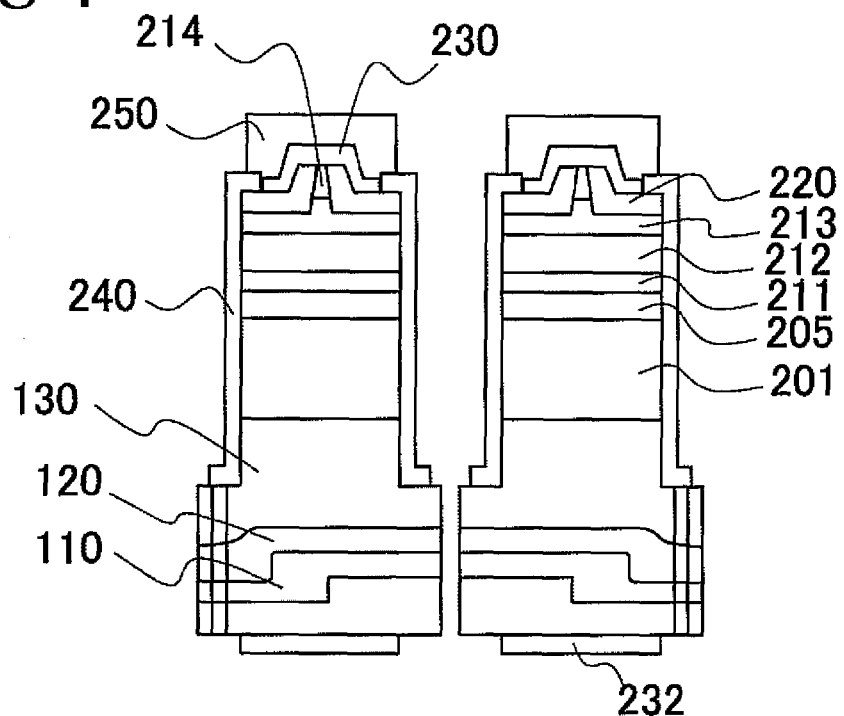

As opposed to Example 1, the reference position for producing the chips is the middle between two high dislocation density regions. As a result, one of the side faces of the chip is a high dislocation density region located inside a recess, and the other side face is a low dislocation density region (see FIG. 4). The chip width is 200 μm. Otherwise, nitride semiconductor laser elements are formed in the same manner as in Example 1.

The nitride semiconductor laser element obtained by Example 1 will have no cracks, or fewer cracks, in the crystal growth step and design step and during drive, whereby expecting excellent service life characteristics.

Furthermore, because the chip width is reduced, twice as many chips could be obtained as in Example 1.

Example 4

As opposed to Example 1, the chip width is set to 600 μm, and three ridge stripes are formed in the interior thereof. All of the ridge stripes are formed away from high dislocation density regions (see FIG. 5).

The nitride semiconductor laser element obtained by Example 1 will have no cracks, or fewer cracks, in the crystal growth step and design step and during drive, whereby expecting excellent service life characteristics.

Furthermore, because the nitride semiconductor laser elements are a multi-array type equipped with three ridge stripes, higher output of at least 150 mW could be anticipated.

Example 5

Figure 7:
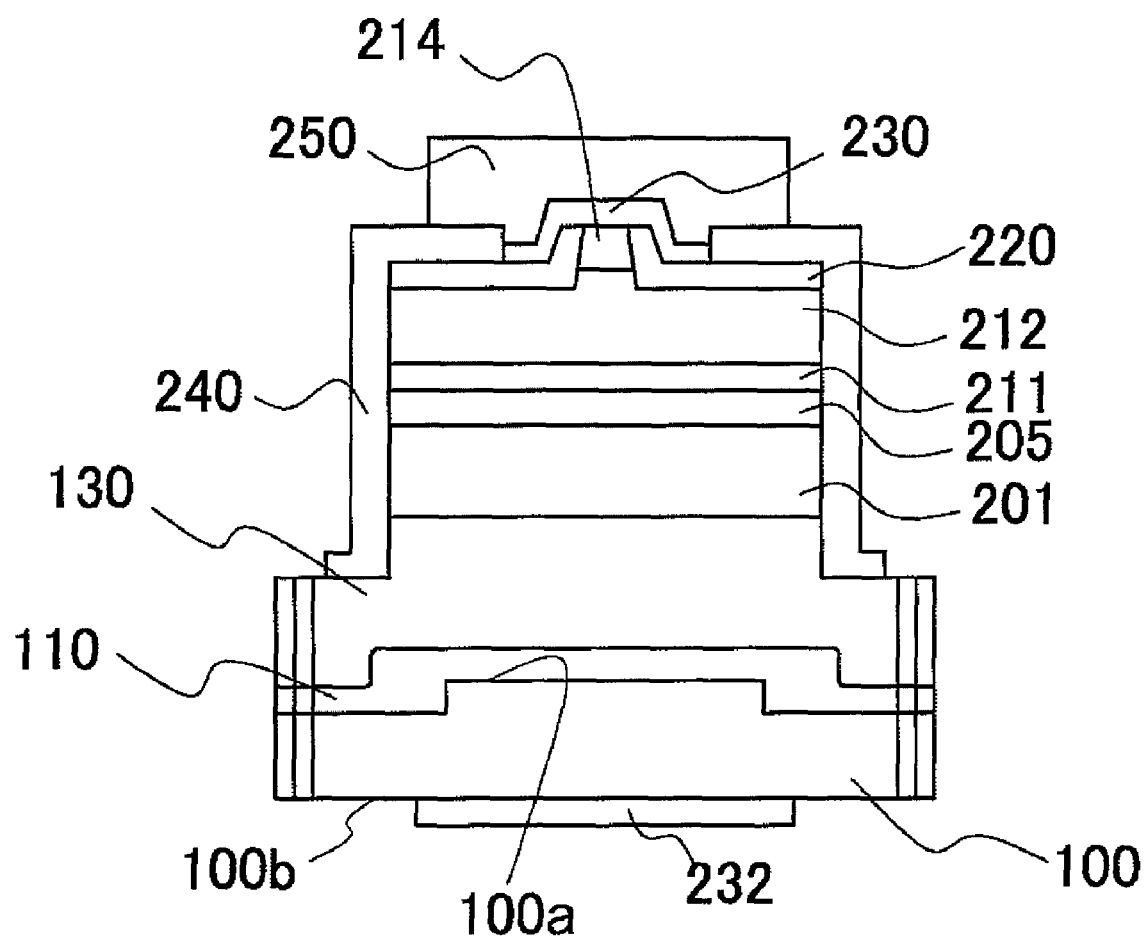

As shown in FIG. 7, the element in this Example is produced in substantially the same manner as the elements in Example 1, except that the configuration of the nitride semiconductor layers is changed as follows;

a first nitride semiconductor layer 110: superlattice structure (average Al mixed crystal: 4.0%) with a total thickness of 1.1 μm composed of 220 pairs of Al$_{0.08}$Ga$_{0.92}$N (film thickness: 25 Å)/GaN (film thickness: 25 Å), a second nitride semiconductor layer is omitted, a third nitride semiconductor layer 130: superlattice structure (average Al mixed crystal: 2.5%) with a total thickness of 3000 Å composed of 60 pairs of Al$_{0.05}$Ga$_{0.95}$N (film thickness: 25 Å)/GaN (film thickness: 25 Å), an n-type nitride semiconductor layer 201 functions as a light guide layer of a core region composed of GaN layer (film thickness: 1700 Å), an active layer 205: a multiple quantum well structure (MQW) with a total thickness of 720 Å, which has 2 pairs of a barrier layer composed of In$_{0.05}$Ga$_{0.95}$N (film thickness: 140 Å) and a well layer composed of In$_{0.1}$Ga$_{0.95}$N (film thickness: 70 Å), and a topmost barrier layer composed of In$_{0.1}$Ga$_{0.9}$N (film thickness: 300 Å), a nitride semiconductor layer 212 functions as a p-type light guide layer composed of GaN layer (film thickness: 1500 Å), a p-type nitride semiconductor layer 213: superlattice structure (average Al mixed crystal: 4.9%) with a total thickness of 4500 Å composed of 300 pairs of Al$_{0.1}$Ga$_{0.9}$N (film thickness: 20 Å)/GaN (film thickness: 20 Å).

The reference position for producing the chips is the high dislocation density regions present in the recesses and on both side faces, just as in Example 1. Producing chips at this position increases the yield in the chip production step. The cavity length is 600 μm, and the chip width is 400 μm.

Also, the nitride semiconductor laser elements of this Example allow for continuous oscillation at an oscillation wavelength of 405 nm, a high output of 30 mW during CW drive, and a threshold current density of 3.5 kA/cm$^2$ at room temperature.

The nitride semiconductor laser element obtained by Example 1 will have no cracks, or fewer cracks, in the crystal growth step and design step and during drive, whereby expecting excellent service life characteristics.

Example 6

As opposed to Example 5, $Al_{0.03}Ga_{0.97}N$ is formed as the first nitride semiconductor layer 110, and GaN is formed (the film thickness: 1700 Å) as the third nitride semiconductor layer. Otherwise, nitride semiconductor laser elements are formed in the same manner as in Example 5.

The nitride semiconductor laser element obtained by this Example shows the same characteristic as in Example 5.

This application claims priority to Japanese Patent Application No. 2006-239161. The entire disclosure of Japanese Patent Application No. 2006-239161 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A nitride semiconductor laser element comprising:
   a nitride semiconductor substrate fabricated to have a high dislocation density region and a low dislocation density region containing lower dislocation than that of the high dislocation density region, and has at least one recess formed in a top surface of the nitride semiconductor substrate in at least the high dislocation density region;
   a first nitride semiconductor layer laminated on the top surface of the nitride semiconductor substrate, and having a recess over the recess in the nitride semiconductor substrate, the first nitride semiconductor layer having
      a first film portion grown from a side face of the recess in the nitride semiconductor substrate in a direction parallel to the top surface of the nitride semiconductor substrate, the first film portion having a first film thickness as measured from a top corner of the recess in the nitride semiconductor substrate in the direction parallel to the top surface of the nitride semiconductor substrate, and
      a second film portion grown in a direction perpendicular to the top surface of the nitride semiconductor substrate in a region other than the recess in the first nitride semiconductor layer, the second film portion having a second film thickness as measured from the top surface of the nitride semiconductor substrate in the direction perpendicular to the top surface of the nitride semiconductor substrate,
      the first film thickness being greater than the second film thickness; and
   a second nitride semiconductor layer laminated on a top surface of the first nitride semiconductor layer and containing indium, the second nitride semiconductor layer having a recess formed over the recess in the first nitride semiconductor layer.

2. The nitride semiconductor laser element according to claim 1, wherein the recess in the nitride semiconductor substrate is formed substantially parallel to the cavity lengthwise direction of the nitride semiconductor laser element.

3. The nitride semiconductor laser element according to claim 1, wherein the high dislocation density region and low dislocation density region of the nitride semiconductor substrate are formed in alternating stripes, and the side faces of the recess in the nitride semiconductor substrate are the low dislocation density regions.

4. The nitride semiconductor laser element according to claim 1, wherein the side faces of the recess in the nitride semiconductor substrate are at least 5 μm away from the end of the high dislocation density region.

5. The nitride semiconductor laser element according to claim 1, wherein the recess in the second nitride semiconductor layer is a region in which dislocations have propagated from the high dislocation density region of the nitride semiconductor substrate.

6. The nitride semiconductor laser element according to claim 1, wherein the first nitride semiconductor layer is a nitride semiconductor layer that contains aluminum.

7. A nitride semiconductor laser element comprising:
   a nitride semiconductor substrate fabricated to have a high dislocation density region and a low dislocation density region containing lower dislocation than that of the high dislocation density region, and having at least one recess formed in a top surface of the nitride semiconductor substrate in at least the high dislocation density region; and
   a first nitride semiconductor layer laminated on the top surface of the nitride semiconductor substrate, and having a recess over the recess in the nitride semiconductor substrate, the first nitride semiconductor layer having
      a first film portion grown from a side face of the recess in the nitride semiconductor substrate in a direction parallel to the top surface of the nitride semiconductor substrate, the first film portion having a first film thickness as measured from a top corner of the recess in the nitride semiconductor substrate in the direction parallel to the top surface of the nitride semiconductor substrate, and
      a second film portion grown in a direction perpendicular to the top surface of the nitride semiconductor substrate in a region other than the recess in the first nitride semiconductor layer, the second film portion having a second film thickness as measured from the top surface of the nitride semiconductor substrate in the direction perpendicular to the top surface of the nitride semiconductor substrate,
      the first film thickness being greater than the second film thickness,
   the first film portion of the first nitride semiconductor layer including dislocations in a region separate from the high dislocation density region of the nitride semiconductor substrate, the dislocations in the first film portion of the first nitride semiconductor layer extending in an in-plane direction parallel to the top surface of the nitride semiconductor substrate in the first film portion.

8. The nitride semiconductor laser element according to claim 7, wherein the density of the dislocations extending in the in-plane direction in the region of growth of the first nitride semiconductor layer in the lateral direction is at least $1 \times 10^8/cm^2$.

9. The nitride semiconductor laser element according to claim 7, wherein
   the nitride semiconductor substrate has the dislocation density of no more than $1 \times 10^7/cm^2$ at the top surface of the nitride semiconductor substrate, the density of the dislocations extending in the in-plane direction in the region of the first nitride semiconductor layer is at least $1\times10^8/\text{cm}^2$.

10. The nitride semiconductor laser element according to claim 7, wherein the first nitride semiconductor layer has a recess on the recess formed in the nitride semiconductor substrate.

11. The nitride semiconductor laser element according to claim 7, wherein the first nitride semiconductor layer is a nitride semiconductor layer that contains aluminum.

12. The nitride semiconductor laser element according to claim 7, wherein a second nitride semiconductor layer is disposed on the first nitride semiconductor layer and contains indium.

13. The nitride semiconductor laser element according to claim 9, wherein the first nitride semiconductor layer has a recess on the recess formed in the nitride semiconductor substrate.

14. The nitride semiconductor laser element according to claim 9, wherein the first nitride semiconductor layer is a nitride semiconductor layer that contains aluminum.

15. The nitride semiconductor laser element according to claim 9, wherein a second nitride semiconductor layer is disposed on the first nitride semiconductor layer and contains indium.

16. The nitride semiconductor laser element according to claim 1, wherein the density of the dislocations in the low dislocation density region is $5\times10^6/\text{cm}^2$ or less.

17. The nitride semiconductor laser element according to claim 1, wherein the radius of curvature of the nitride semiconductor substrate is at least 0.1 m.

18. The nitride semiconductor laser element according to claim 1, further comprising
an active layer disposed above the second nitride semiconductor layer, with the active layer being configured and arranged to emit light in the ultraviolet band.

19. The nitride semiconductor laser element according to claim 1, further comprising
an active layer disposed above the second nitride semiconductor layer, with the active layer having a quantum well structure including at least a well layer and at least a barrier layer with the barrier layer being a nitride semiconductor layer containing aluminum.

20. The nitride semiconductor laser element according to claim 7, wherein the density of dislocations in the low dislocation density region is $5\times10^6/\text{cm}^2$ or less.

21. The nitride semiconductor laser element according to claim 7, wherein the radius of curvature of the nitride semiconductor substrate is at least 0.1 m.

22. The nitride semiconductor laser element according to claim 7, further comprising
an active layer disposed above the first nitride semiconductor layer, with the active layer being configured and arranged to emit light in the ultraviolet band.

23. The nitride semiconductor laser element according to claim 1, further comprising
an active layer disposed above the first nitride semiconductor layer, with the active layer having a quantum well structure including at least a well layer and at least a barrier layer with the barrier layer being a nitride semiconductor layer containing aluminum.

* * * * *